(12) United States Patent
Choi

(10) Patent No.: US 6,197,625 B1
(45) Date of Patent: Mar. 6, 2001

(54) METHOD OF FABRICATING A THIN FILM TRANSISTOR

(75) Inventor: Jae-Beom Choi, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/213,321

(22) Filed: Dec. 16, 1998

(30) Foreign Application Priority Data

Dec. 29, 1997 (KR) .................................................. 97/76636

(51) Int. Cl.⁷ .............................. H01L 21/00; H01L 21/20
(52) U.S. Cl. ........................ 438/158; 438/159; 438/162; 438/482; 438/484
(58) Field of Search ..................................... 438/159, 158, 438/162, 30, 482, 484, 155, 183, 200, 261, 749, 750, 751

(56) References Cited

U.S. PATENT DOCUMENTS

| | | | |
|---|---|---|---|
| 4,905,066 * | 2/1990 | Dohjo et al. ...................... | 357/23.15 |
| 4,956,680 * | 9/1990 | Tanaka et al. ........................... | 357/4 |
| 4,975,760 * | 12/1990 | Dohjo ..................................... | 357/71 |
| 5,183,780 * | 2/1993 | Noguchi et al. ...................... | 437/173 |
| 5,284,789 * | 2/1994 | Mori et al. ............................ | 437/113 |
| 5,327,001 * | 7/1994 | Wakai et al. .......................... | 257/350 |
| 5,763,904 * | 6/1998 | Nakajima et al. ..................... | 257/66 |
| 5,874,326 * | 2/1999 | Lyu ...................................... | 438/158 |
| 5,877,514 * | 3/1999 | Seo ......................................... | 257/72 |
| 5,913,113 * | 7/1999 | Seo ...................................... | 438/166 |
| 5,926,701 * | 7/1999 | Li ........................................ | 438/158 |
| 6,010,923 * | 1/2000 | Jinno .................................... | 438/158 |
| 6,025,216 * | 2/2000 | Ha ........................................ | 438/161 |

* cited by examiner

*Primary Examiner*—Richard Elms
*Assistant Examiner*—Michael S. Lebentritt
(74) *Attorney, Agent, or Firm*—Long Aldridge & Norman LLP

(57) ABSTRACT

A method of fabricating a thin film transistor having a vertical offset layer which prevents the damage on an active layer due to the etching plasma by preserving the vertical offset layer during an etching process for separating an ohmic contact layer. The method includes forming a gate electrode on an insulating substrate, forming a first insulating layer on the gate electrode and an exposed surface of the insulating substrate, forming an active layer on the first insulating layer, forming successively an amorphous silicon layer and a heavily-doped amorphous silicon layer on the entire surface including the active layer, forming a vertical offset layer and an ohmic contact layer by simultaneously patterning the /heavily-doped amorphous silicon layer and the amorphous silicon layer, forming a source electrode and a drain electrode connected to the ohmic contact layer, and removing an exposed portion of the ohmic contact layer by etching the ohmic contact layer using the source electrode and the drain electrode as etch masks.

24 Claims, 6 Drawing Sheets ic # METHOD OF FABRICATING A THIN FILM TRANSISTOR

BACKGROUND OF THE INVENTION

1. Field of the Invention

The present invention relates to a method of fabricating a thin film transistor having a vertical offset layer which prevents damages on an active layer due to etching plasma by preserving the vertical offset layer during an etching process when forming a divided ohmic contact layer.

2. Discussion of the Related Art

The development of laser crystallization enables fabrication of polycrystalline silicon thin film transistor ("TFT") on a large-scale glass substrate at normal temperatures used for fabricating amorphous silicon TFTs. Compared to an amorphous silicon TFT, a polycrystalline silicon TFT has higher mobility electrons and holes and enables the formation of a complementary MOS thin film transistor ("CMOS TFT").

A liquid crystal display ("LCD") using polycrystalline silicon TFTs includes a driver and a pixel array on a glass substrate. The TFTs in the driver perform fast switching operations due to the desirable characteristic of polycrystalline silicon. However, the TFTs for switching pixels in the pixel array degrade image quality because the voltage width of pixel electrodes is broadened due to a large drain current during the off-state of the TFT. A lightly doped drain or an offset structure have been applied to TFTs in order to reduce the off current in a pixel array.

FIGS. 1A to 1D are cross-sectional views illustrating a process of fabricating a TFT having a vertical offset layer according to a first technique of the related art. Referring to FIG. 1A, a gate electrode 10 is formed on an insulating substrate 100, and a first insulating layer 11 is deposited over the gate electrode and an exposed surface of the substrate 100. An amorphous silicon layer is deposited on the first insulating layer 11 and crystallized by a laser beam. An active layer 12 is then formed by etching the crystallized silicon layer using photolithography. A conventional back-exposure method may be used in the photolithography process.

Referring to FIG. 1B, an amorphous silicon layer and an amorphous silicon layer heavily doped with impurities are successively deposited over the active layer 12 and an exposed surface of the substrate 100. An ohmic contact layer 14 is formed by patterning the heavily-doped amorphous silicon layer with photolithography, and a vertical offset layer 13 is formed by etching the amorphous silicon layer under the ohmic contact layer 14.

Referring to FIG. 1C, a source electrode 15S and a drain electrode 15D are formed by disposing a conductive layer on the ohmic contact layer 14 and an exposed surface of the substrate 100, and by etching the conductive layer using photolithography.

Referring to FIG. 1D, a part of the ohmic contact layer 14 which is not protected by the source and drain electrodes 15S and 15D (which act as etch masks) is removed by etching. The exposed portions of the vertical offset layer 13 not covered by the remaining ohmic contact layer 14 is also removed by etching.

In the above technique of the related art, as shown in FIG. 1D, the ohmic contact layer 14 is divided into two portions for the purpose of switching the TFT. This is done by the etching process using the source and the drain electrodes 15S and 15D as etch masks. Generally, the ohmic contact layer 14 is patterned by a dry etch method which removes the etched layer which has been reacted with a plasma in a vacuum chamber and become volatile.

However, when the ohmic contact layer 14 is divided by etching according to the related art, a surface of the active layer 12 is exposed during the process of dividing the vertical offset layer 13. The exposed portion of the active layer 12 is generally damaged and partially etched by the plasma during etching, thereby degrading the characteristics of the TFT.

FIGS. 2A to 2D are cross-sectional views illustrating a process of fabricating a TFT having a vertical offset layer according to a second technique of the related art. Referring to FIG. 2A, a gate electrode 20 is formed on an insulating substrate 200, and a first insulating layer 21 is deposited over the gate electrode and an exposed surface of the substrate. An amorphous silicon layer is formed on the first insulating layer 21 and subsequently crystallized by laser crystallization. An active layer 22 is formed by patterning the crystallized layer using photolithography. A conventional back-exposure method may be used in the photolithography process.

Referring to FIG. 2B, a vertical offset layer 23 is formed on the active layer 22 by depositing another amorphous silicon layer over the active layer 22 and an exposed surface of the substrate 200, and subsequently etching the amorphous layer using photolithography. Referring to FIG. 2C, a heavily-doped amorphous silicon layer 24a and a conductive layer 25a are successively deposited over the vertical offset layer 23 and an exposed surface of the substrate 200. Referring to FIG. 2D, source and drain electrodes 25S and 25D are formed by etching the conductive layer 25a using photolithography. The amorphous silicon layer 24a is etched by using the source and the drain electrodes 25S and 25D as etch masks to form an ohmic contact layer 24 having two portions divided from each other.

In the above techniques of the related art, the step of depositing an amorphous silicon layer to form the vertical offset layer and the step of depositing a heavily-doped amorphous silicon layer to form the ohmic contact layer are processed non-successively. Thus, the substrate is transferred from one processing chamber to another for depositing various materials, which makes defects state at the interface between the amorphous silicon layer and doped amorphous silicon layer.

Moreover, each depositing step requires its own cleaning process. As a result, the manufacturing processes are time-consuming and complicated. The complicated manufacturing processes render a lower yield.

SUMMARY OF THE INVENTION

Accordingly, the present invention is directed to a method of fabricating a thin film transistor that substantially obviates one or more of the problems due to limitations and disadvantages of the related art.

An object of the present invention is to provide a method of fabricating a TFT which simplifies the fabrication process and prevents damages on an active layer by depositing successively an amorphous silicon layer for forming a vertical offset layer on the active layer and a heavily-doped amorphous silicon layer for forming an ohmic contact layer and by preserving the vertical offset layer when the ohmic contact layer is etched to form a divided layer.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes the steps of forming a gate electrode on an insulating substrate, forming a first insulating layer over the gate electrode and an exposed surface of the insulating substrate, forming an active layer on the first insulating layer, forming successively an amorphous silicon layer and a heavily-doped amorphous silicon layer on the whole substrate surface including the active layer, forming a vertical offset layer and an ohmic contact layer by simultaneously patterning the heavily-doped amorphous silicon layer and the amorphous silicon layer, forming a source electrode and a drain electrode connected to the ohmic contact layer, and removing an exposed portion of the ohmic contact layer by etching the ohmic contact layer using the source electrode and the drain electrode as etch masks.

In another aspect, the present invention includes the steps of forming a gate electrode on an insulating substrate, forming a first insulating layer over the gate electrode and an exposed surface of the insulating substrate, forming a first amorphous silicon layer on the first insulating layer, forming a crystallized silicon layer by crystallizing the first amorphous silicon layer, forming successively a second amorphous silicon layer and a heavily-doped amorphous silicon layer on the crystallized silicon layer, forming an active layer, a vertical offset layer and an ohmic contact layer by etching the heavily-doped amorphous silicon layer, the second amorphous silicon layer and the crystallized silicon layer, forming a source and a drain electrode connected to the ohmic contact layer, and removing an exposed portion of the ohmic contact layer by etching the ohmic contact layer using the source and the drain electrode as etch masks.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention.

DETAILED DESCRIPTION OF PREFERRED EMBODIMENTS

Reference will now be made in detail to the preferred embodiment of the present invention, an example of which is illustrated in the accompanying drawings.

Figure 1A:
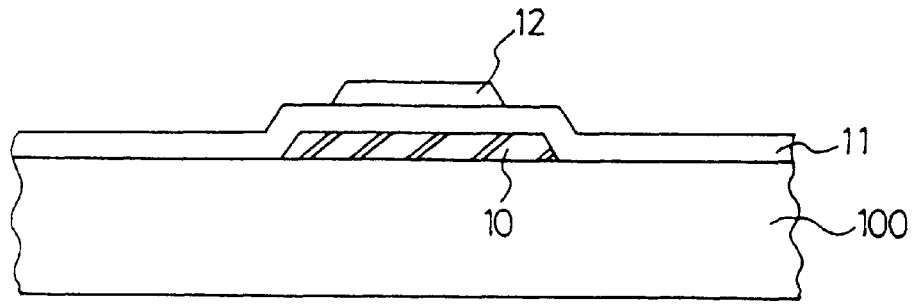
FIGS. 1A to 1D are cross-sectional views illustrating a process of fabricating a TFT having a vertical offset layer according to a first technique of the related art.
Figure 1B:
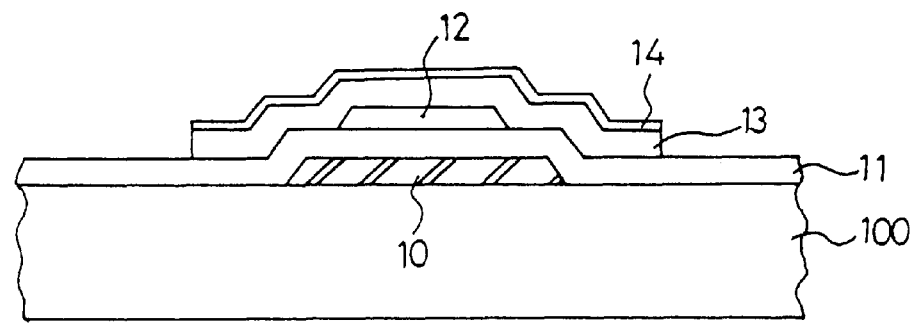
Figure 1C:
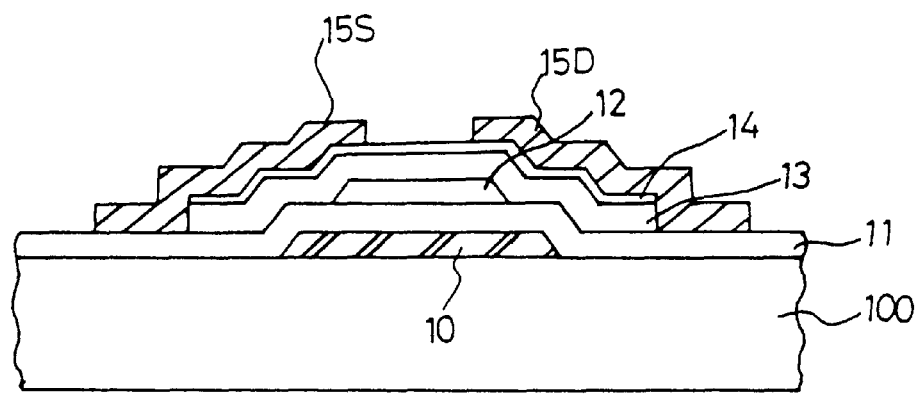
Figure 1D:
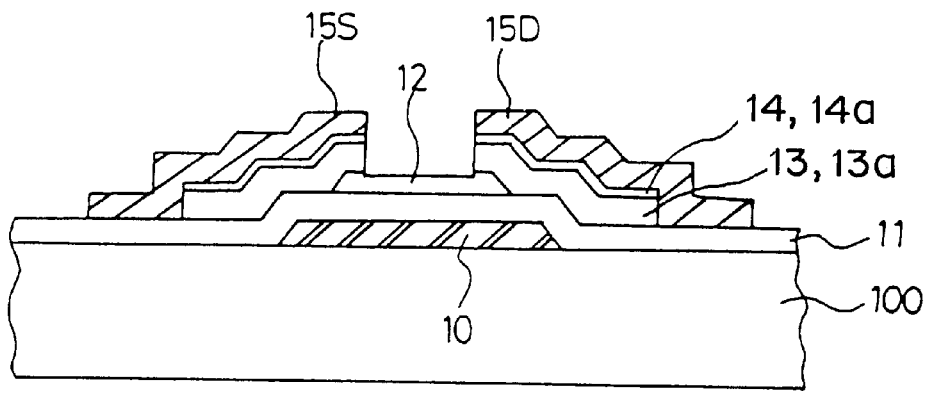
Figure 2A:
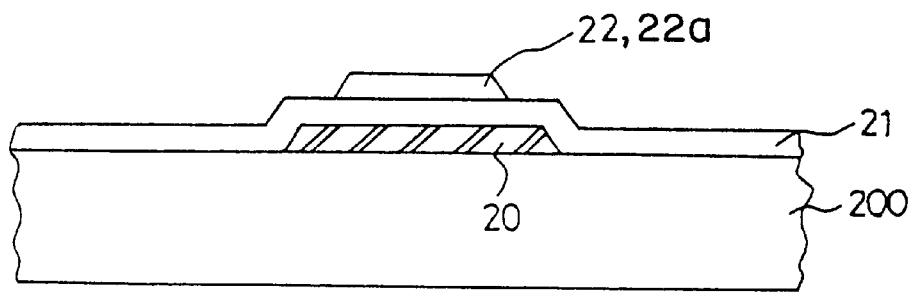
FIGS. 2A to 2D are cross-sectional views illustrating a process of fabricating a TFT having a vertical offset layer according to a second technique of the related art.
Figure 2B:
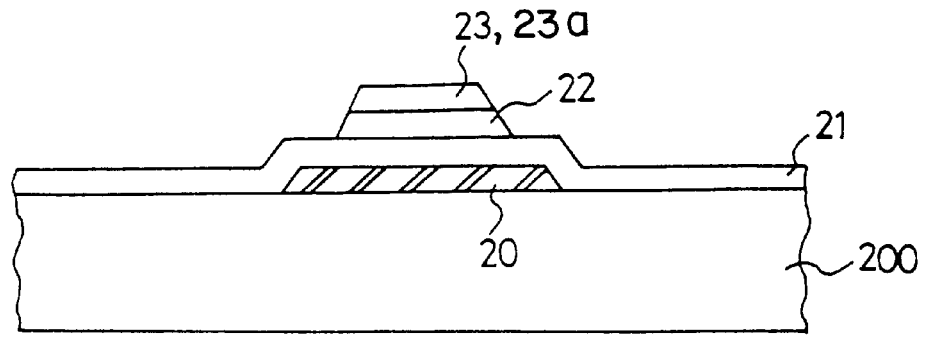
Figure 2C:
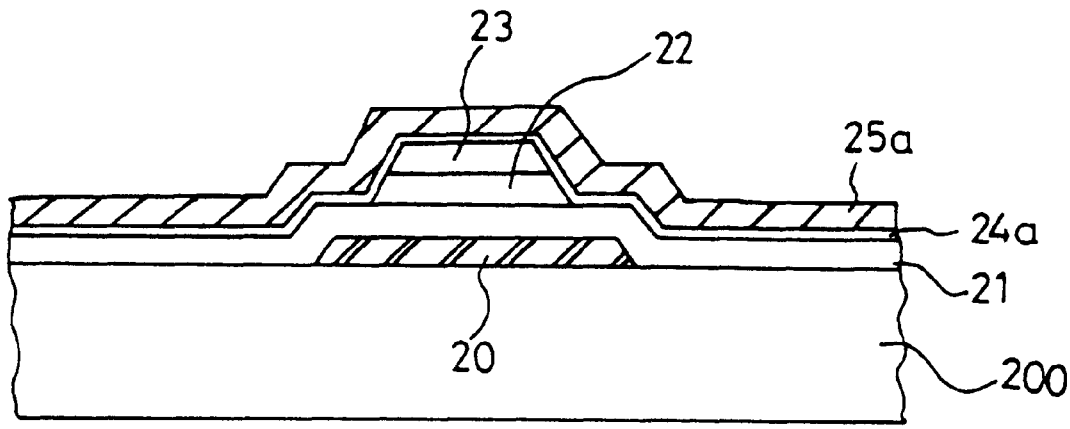
Figure 2D:
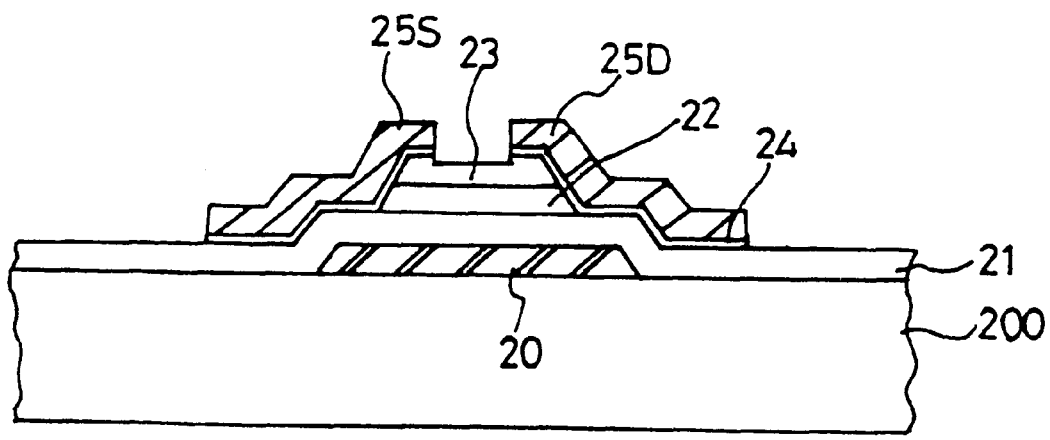
Figure 3A:
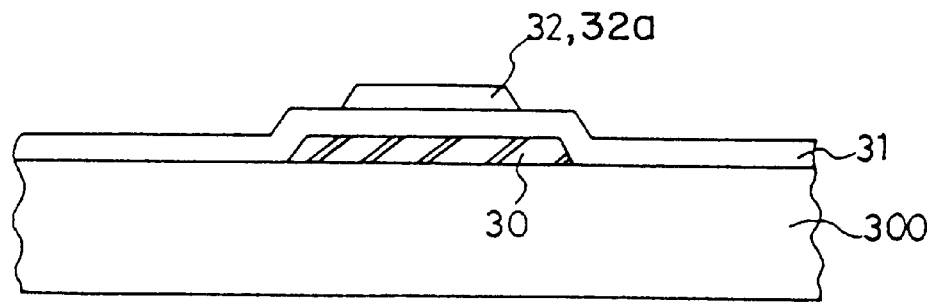
FIGS. 3A to 3D are cross-sectional views illustrating a process of fabricating a TFT having a vertical offset layer according to a first embodiment of the present invention.

FIGS. 3A to 3D are cross-sectional views illustrating a process of fabricating a TFT having a vertical offset layer according to a first embodiment of the present invention. Referring to FIG. 3A, a gate electrode 30 is formed on a substrate 300 by depositing and patterning a conductive layer. The processing of fabricating such gate electrode 30 is well known in the art. A first insulating layer 31 is then deposited on a surface of the insulating substrate 300 including the gate electrode. An amorphous silicon layer is deposited on the first insulating layer 31 and crystallized preferably by a laser. An active layer 32 is then formed by etching the crystallized layer using photolithography or other suitable process known to one of ordinary skill in the art. A conventional back-exposure method may be used in the photolithography process.

Figure 3B:
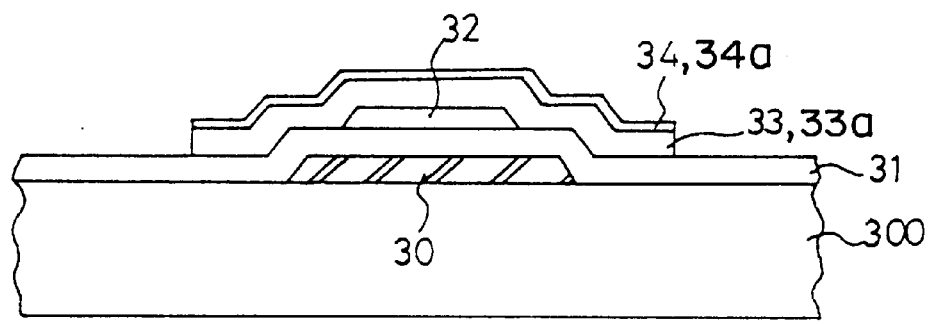

Referring to FIG. 3B, an amorphous silicon layer and an amorphous silicon layer heavily doped with impurities are successively deposited over the active layer 32 and an exposed surface of the substrate. An ohmic contact layer 34 is formed by patterning the heavily-doped amorphous silicon layer using photolithography or other suitable process known to one of ordinary skill in the art, and a vertical offset layer 33 is formed by etching the amorphous silicon layer under the ohmic contact layer 34. In this case, the TFT has a multi-channel structure as the vertical offset layer 33 is placed on the active layer 32.

Figure 3C:
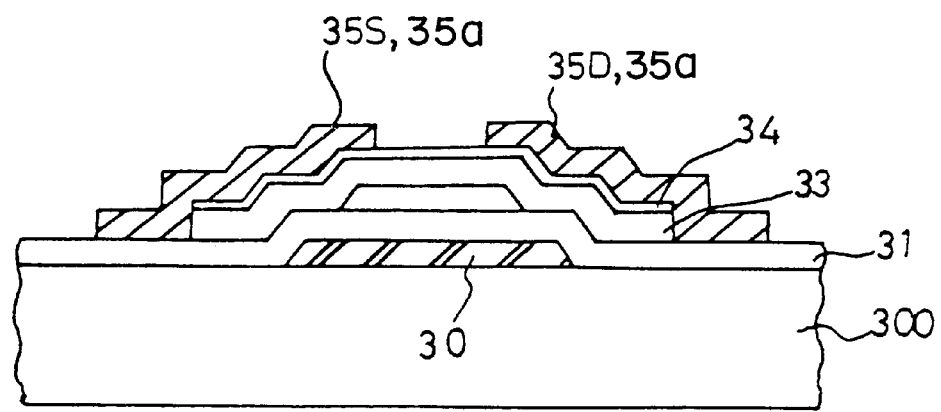

Referring to FIG. 3C, a conductive layer is deposited on the ohmic contact layer 34 and an exposed surface of the substrate 300. A source electrode 35S and a drain electrode 35D are formed by etching the conductive layer 35 using photolithography or other suitable process known to one of ordinary skill in the art. As a result, the source and drain electrodes 35S and 35D are connected to the ohmic contact layer 34.

Figure 3D:
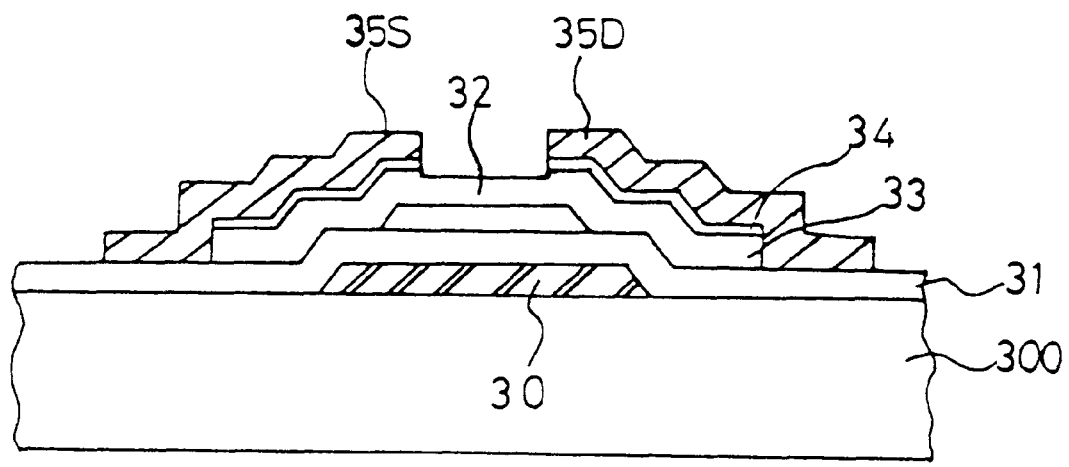

Referring to FIG. 3D, a part of the ohmic contact layer 34 that is not protected by the source and drain electrodes 35S and 35D (which act as etch masks) is removed. In this case, a portion of the vertical offset layer 33 in the area exposed by the etched area of the ohmic contact layer 34 is preserved and remains intact to prevent the upper part of the active layer from being damaged by etching plasma.

Figure 4A:
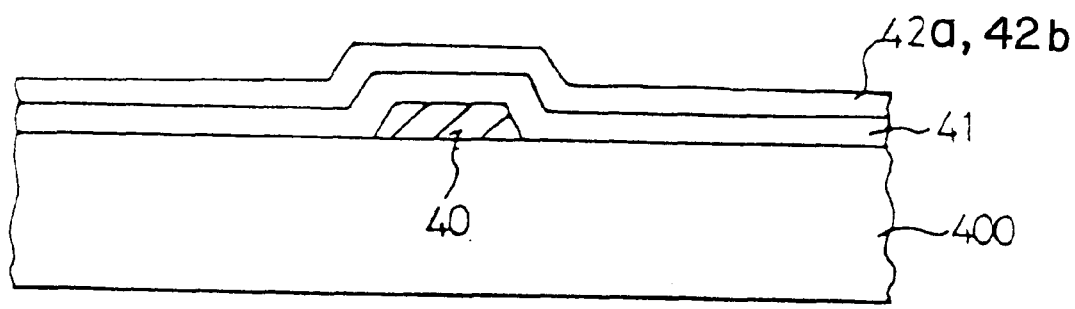
FIGS. 4A to 4D are cross-sectional views illustrating a process of fabricating a TFT having a vertical offset layer according to a second embodiment of the present invention.

FIGS. 4A to 4D are cross-sectional views illustrating a process of fabricating a TFT having a vertical offset layer according to a second embodiment of the present invention. Referring to FIG. 4A, a gate electrode 40 is formed by photolithography after a conductive layer has been deposited on an insulating substrate 400. A first insulating layer 41 and an amorphous silicon layer are deposited on the gate electrode 40 and an exposed surface of the substrate 400, successively. Then, a polycrystalline silicon layer 42a is formed by crystallizing the amorphous silicon layer using a laser.

Figure 4B:
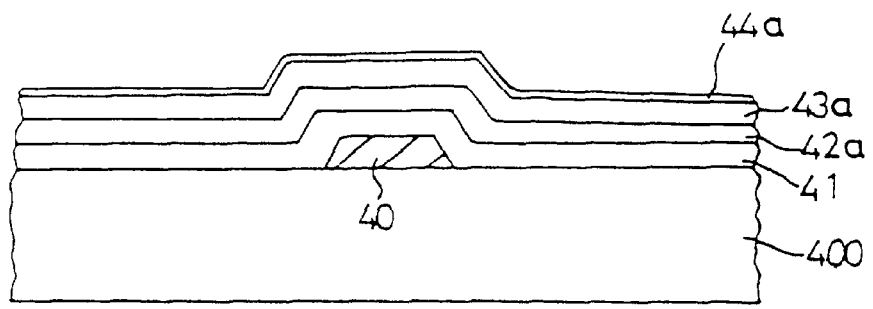

Referring to FIG. 4B, an amorphous silicon layer 43a for a vertical offset layer and a heavily-doped amorphous silicon layer 44a for an ohmic contact layer are successively deposited on the crystallized silicon layer 42a. A series of these successive depositions of layers simplify the fabrication steps.

Figure 4C:
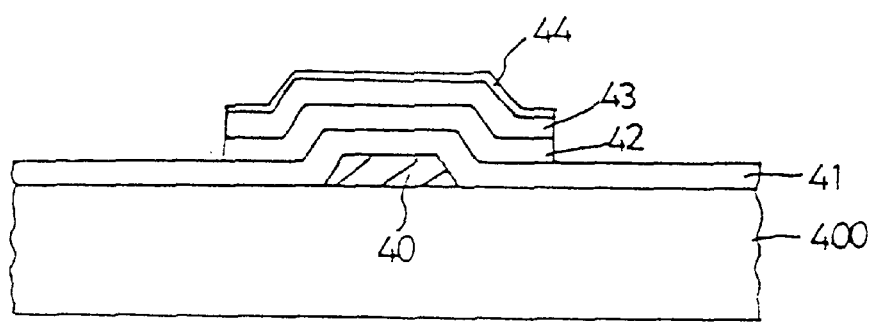

Referring to FIGS. 4C, an ohmic contact layer 44, a vertical offset layer 43 and an active layer 42 are formed by patterning the heavily-doped amorphous silicon layer 44a, the amorphous silicon layer 43a under the heavily-doped amorphous silicon layer, and the crystallized silicon layer 42a, respectively and successively. In this case, the TFT fabricated by this embodiment has a multi-channel structure as the vertical offset layer 33 is placed on the active layer 32.

Figure 4D:
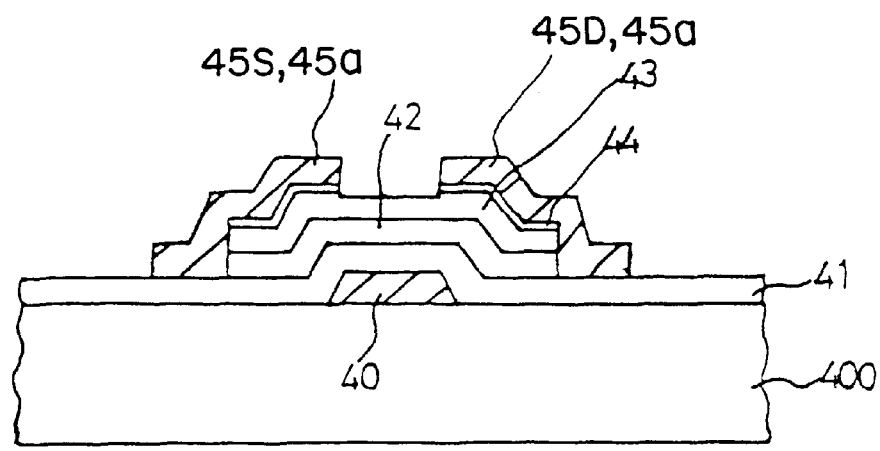

Referring to FIG. 4D, a conductive layer is deposited on the ohmic contact layer 44 and an exposed surface of the substrate 400, and a source electrode 45S and a drain electrode 45D are formed by etching the conductive layer using photolithography. The source and drain electrodes 45S and 45D are connected to the ohmic contact layer 44.

A part of the ohmic contact layer 44 that is not protected by the source electrode 35S and the drain electrode 45D (which act as etch masks) is removed. In this case, a portion of the vertical offset layer 43 is preserved and remains intact to prevent the upper part of the active layer 42 from being damaged by the etching plasma.

The present invention simplifies the fabrication process and prevents damages on the active layer by depositing successively an amorphous silicon layer for forming a vertical offset layer on the active layer and a heavily-doped amorphous silicon layer for an ohmic contact layer and by preserving the vertical offset layer when the ohmic contact layer is divided into two portions.

The present invention simplifies the fabrication process and prevents damages on the active layer by depositing successively an amorphous silicon layer for forming a vertical offset layer on the active layer and a heavily-doped amorphous silicon layer for an ohmic contact layer and by preserving the vertical offset layer when the ohmic contact layer is divided.

It will be apparent to those skilled in the art that various modifications and variations can be made in a method of fabricating a thin film transistor of the present invention without departing from the spirit or scope of the inventions. Thus, it is intended that the present invention covers the modifications and variations of this invention provided they come within the scope of the appended claims and equivalents.

What is claimed is:

1. A method of fabricating a thin film transistor, comprising the steps of:
   forming a gate electrode on a substrate;
   forming a first insulating layer on the gate electrode and an exposed surface of the substrate;
   forming an active layer on the first insulating layer;
   forming successively an amorphous silicon layer and a heavily-doped amorphous silicon layer over the active layer and the first insulating layer;
   forming an ohmic contact layer and a vertical offset layer by simultaneously patterning the heavily-doped amorphous silicon layer and the amorphous silicon layer;
   forming a source electrode and a drain electrode connected to the ohmic contact layer; and
   etching a portion of the ohmic contact layer using the source electrode and the drain electrode as etch masks.

2. The method of claim 1, wherein the step of forming the active layer comprises:
   depositing a first amorphous silicon layer on the first insulating layer;
   forming a crystallized silicon layer by crystallizing the first amorphous silicon layer; and
   etching the crystallized silicon layer.

3. The method of claim 2, wherein the crystallized silicon layer is etched using photolithography.

4. A method of fabricating a thin film transistor, comprising the steps of:
   forming a gate electrode on an insulating substrate;
   forming a first insulating layer on the gate electrode and an exposed surface of the insulating substrate;
   forming a first amorphous silicon layer on the first insulating layer;
   forming a crystallized silicon layer by crystallizing the first amorphous silicon layer;
   forming successively a second amorphous silicon layer and a heavily-doped amorphous silicon layer on said crystallized silicon layer;
   forming an ohmic contact layer, a vertical offset layer and an active layer by etching the heavily-doped amorphous silicon layer, the second amorphous silicon layer and the crystallized silicon layer;
   forming source and drain electrodes connected to said ohmic contact layer; and
   removing an exposed portion of the ohmic contact layer by etching the ohmic contact layer using the source and drain electrodes as etch masks.

5. A method of fabricating a thin film transistor, comprising the steps of:
   forming a first electrode on a substrate;
   forming a first insulating layer over at least a portion of the first electrode and at least a portion of the substrate;
   forming an active layer over the first insulating layer;
   forming a first silicon layer over the active layer and at least a portion of the first insulating layer;
   forming a contact layer and a vertical offset layer by patterning the first silicon layer;
   forming a source electrode and a drain electrode over the contact layer; and
   etching a portion of the contact layer using the source electrode and the drain electrode as etch masks.

6. The method of claim 5, wherein the step of forming the active layer comprises:
   depositing an amorphous silicon layer on the first insulating layer;
   transforming the amorphous silicon layer to a crystallized silicon layer; and
   etching the crystallized silicon layer to a predetermine patter.

7. The method of claim 5, wherein the first electrode is a gate electrode.

8. The method of claim 5, wherein the first silicon layer is an amorphous silicon layer.

9. The method of claim 5, wherein the second silicon layer is a heavily-doped amorphous silicon layer.

10. The method of claim 9, wherein the second silicon layer is a heavily-doped amorphous silicon layer.

11. The method of claim 5, wherein the contact layer is an ohmic contact layer.

12. The method of claim 5, further comprising the step of forming a second silicon layer over the first silicon layer; and
   forming the contact layer and the vertical offset layer by simultaneous patterning the first and second silicon layers.

13. The method of claim 12, wherein the step of forming the active layer comprises:
   depositing an amorphous silicon layer on the first insulating layer;
   transforming the amorphous silicon layer to a crystallized silicon layer; and
   etching the crystallized silicon layer to a predetermine patter.

14. The method of claim 12, wherein the first electrode is a gate electrode.

15. The method of claim 12, wherein the first silicon layer is an amorphous silicon layer.

16. The method of claim 12, wherein the second silicon layer is a heavily-doped amorphous silicon layer.

17. The method of claim 6, wherein the second silicon layer is a heavily-doped amorphous silicon layer.

18. The method of claim 12, wherein the contact layer is an ohmic contact layer.

19. A product manufactured according to the process of claim 5.

20. A method of fabricating a thin film transistor, comprising the steps of:

forming a gate electrode on a substrate;

forming a first insulating layer on the gate electrode and at least a portion of the substrate;

forming a first silicon layer over the first insulating layer;

forming a crystallized silicon layer by crystallizing the first silicon layer;

forming a second silicon layer over the crystallized silicon layer and at least a portion of the first insulating layer;

forming a third silicon layer over the second silicon layer;

forming a contact layer, a vertical offset layer and an active layer by etching the second and third silicon layers and the crystallized silicon layer;

forming source and drain electrodes connected to the contact layer; and removing an exposed portion of the contact layer by etching the contact layer using the source and drain electrodes as etch masks.

21. The method of claim 20, wherein the first and second silicon layers are amorphous silicon layers.

22. The method of claim 20, wherein the third silicon layer is a heavily-doped amorphous silicon layer.

23. The method of claim 20, wherein the contact layer is an ohmic contact layer.

24. A product manufactured according to the process of claim 20.

* * * * *